United States Patent
Camarota

(10) Patent No.: US 10,784,121 B2
(45) Date of Patent: Sep. 22, 2020

(54) STANDALONE INTERFACE FOR STACKED SILICON INTERCONNECT (SSI) TECHNOLOGY INTEGRATION

(71) Applicant: Xilinx, Inc., San Jose, CA (US)

(72) Inventor: Rafael C. Camarota, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/237,384

(22) Filed: Aug. 15, 2016

(65) Prior Publication Data
US 2018/0047663 A1   Feb. 15, 2018

(51) Int. Cl.
*H01L 25/065* (2006.01)
*H01L 23/538* (2006.01)
(Continued)

(52) U.S. Cl.
CPC ...... *H01L 21/4853* (2013.01); *H01L 23/5384* (2013.01); *H01L 25/0652* (2013.01); *H01L 25/0655* (2013.01); *H01L 25/18* (2013.01); *H01L 29/0657* (2013.01); *H01L 24/16* (2013.01); *H01L 2224/16145* (2013.01); *H01L 2224/16227* (2013.01); *H01L 2225/06513* (2013.01); *H01L 2225/06517* (2013.01);
(Continued)

(58) Field of Classification Search
CPC ............. H01L 23/5252; H01L 23/5256; H01L 23/5382; H01L 2924/3011; H01L 2924/0002; H01L 25/0657; H01L 27/0688; H01L 2824/15794; H03K 19/17736; H03K 19/1778; H05K 1/144

USPC ......... 257/737, 686, 693, 777.778, E25.006, 257/E25.021, 723; 438/108, 109; 716/100, 52

See application file for complete search history.

(56) References Cited

U.S. PATENT DOCUMENTS 5,724,497 A  *  3/1998  San ................. G06T 11/203
                                         345/469
6,686,768 B2 *  2/2004  Comer ............ H01L 23/5252
                                         257/686

(Continued)

FOREIGN PATENT DOCUMENTS

EP       300287/     4/2016
WO    2013119309     8/2013

*Primary Examiner* — Thinh T Nguyen
(74) *Attorney, Agent, or Firm* — Patterson + Sheridan, LLP

(57) ABSTRACT

Methods and apparatus are described for adding one or more features (e.g., high bandwidth memory (HBM)) to an existing qualified stacked silicon interconnect (SSI) technology programmable IC die (e.g., a super logic region (SLR)) without changing the programmable IC die (e.g., adding or removing blocks). One example integrated circuit (IC) package generally includes a package substrate; at least one interposer disposed above the package substrate and comprising a plurality of interconnection lines; a programmable IC die disposed above the interposer; a fixed feature die disposed above the interposer; and an interface die disposed above the interposer and configured to couple the programmable IC die to the fixed feature die using a first set of interconnection lines routed through the interposer between the programmable IC die and the interface die and a second set of interconnection lines routed through the interposer between the interface die and the fixed feature die.

15 Claims, 8 Drawing Sheets

(51) Int. Cl.
*H01L 21/48* (2006.01)
*H01L 29/06* (2006.01)
*H01L 25/18* (2006.01)
*H01L 23/00* (2006.01)

(52) U.S. Cl.
CPC .......... *H01L 2924/1431* (2013.01); *H01L 2924/1434* (2013.01); *H01L 2924/157* (2013.01); *H01L 2924/15192* (2013.01); *H01L 2924/15311* (2013.01)

(56) References Cited

U.S. PATENT DOCUMENTS

| | | | |
|---|---|---|---|
| 7,587,549 B1 * | 9/2009 | Arulambalam et al. | G06F 3/0613 711/112 |
| 7,892,885 B2 * | 2/2011 | Caron | H01L 21/486 257/685 |
| 8,018,065 B2 * | 9/2011 | Lam | H01L 21/56 257/620 |
| 8,081,527 B1 * | 12/2011 | Venkatarannan et al. | G06F 13/16889 365/154 |
| 8,384,417 B2 * | 2/2013 | Laisne | H01L 25/0657 326/10 |
| 8,539,420 B2 | 9/2013 | Camarota | |
| 8,546,955 B1 * | 10/2013 | Wu | H01L 23/5384 257/777 |
| 8,611,159 B1 * | 12/2013 | Sasaki | G11C 29/022 365/189.02 |
| 9,065,722 B2 * | 6/2015 | Thottethodi | G06F 17/5068 |
| 9,099,999 B1 * | 8/2015 | Wang | H03K 17/00 |
| 9,213,866 B1 | 12/2015 | Ahmad et al. | |
| 2006/0050488 A1 * | 3/2006 | Goodwin | G11C 5/04 361/749 |
| 2012/0124257 A1 | 5/2012 | Wu | |
| 2012/0147567 A1 | 6/2012 | Lee et al. | |
| 2013/0141442 A1 * | 6/2013 | Brothers et al. | H01L 25/0652 345/502 |
| 2013/0159587 A1 * | 6/2013 | Nygren | G11C 29/702 710/306 |
| 2013/0200511 A1 * | 8/2013 | Banijamali | H01L 25/0652 257/737 |
| 2013/0214432 A1 * | 8/2013 | Wu et al. | H01L 23/147 257/782 |
| 2013/0292840 A1 * | 11/2013 | Shoemaker | H01L 27/108 257/773 |
| 2013/0333921 A1 * | 12/2013 | Hisamura | H01L 21/4846 174/250 |
| 2014/0042643 A1 * | 2/2014 | Yu et al. | H01L 21/486 257/774 |
| 2014/0049932 A1 * | 2/2014 | Camarota | H01L 23/145 361/807 |
| 2014/0108891 A1 * | 4/2014 | Strasser | G06F 12/0246 714/773 |
| 2014/0177626 A1 * | 6/2014 | Thotterthodi et al. | H01L 25/0652 257/774 |
| 2015/0347032 A1 * | 12/2015 | Muraoka | G11C 5/04 711/154 |
| 2016/0098061 A1 * | 4/2016 | Teh | H03K 19/01855 713/600 |
| 2016/0099197 A1 * | 7/2016 | Uematsu et al. | H01L 23/498 257/759 |
| 2016/0307365 A1 * | 10/2016 | Liao | G06T 1/20 |
| 2016/0379686 A1 * | 12/2016 | Burger | G06F 3/0604 711/170 |
| 2017/0062383 A1 * | 3/2017 | Yee | H01L 25/0652 |
| 2017/0161942 A1 * | 6/2017 | Deshwal | G06T 11/40 |
| 2018/0024935 A1 * | 1/2018 | Meswani | G06F 12/0893 711/145 |

* cited by examiner

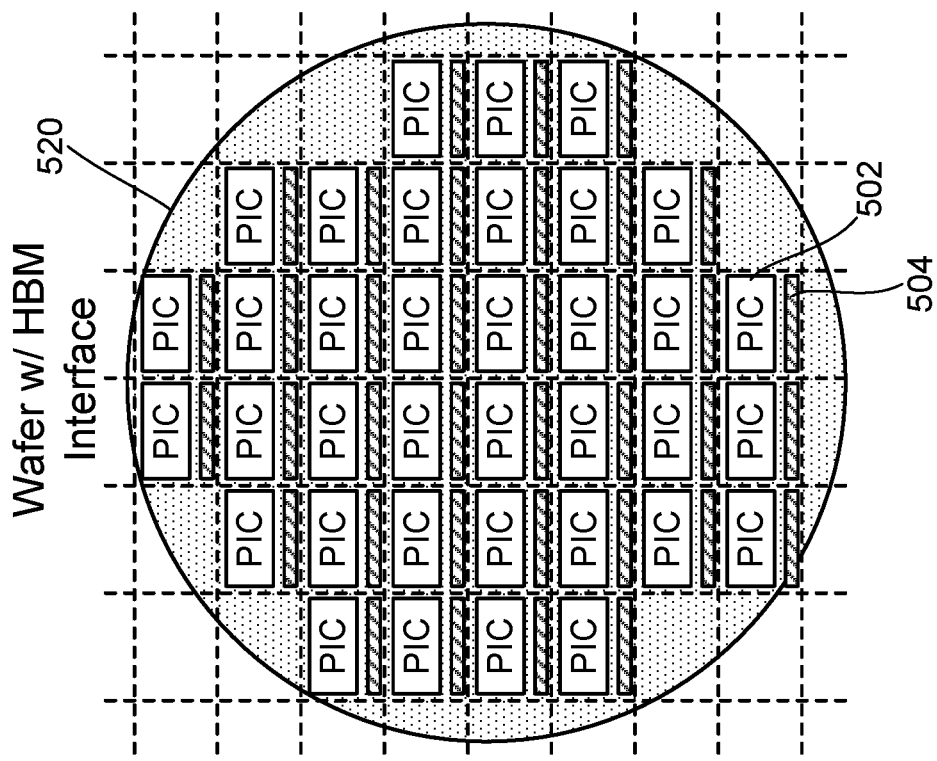
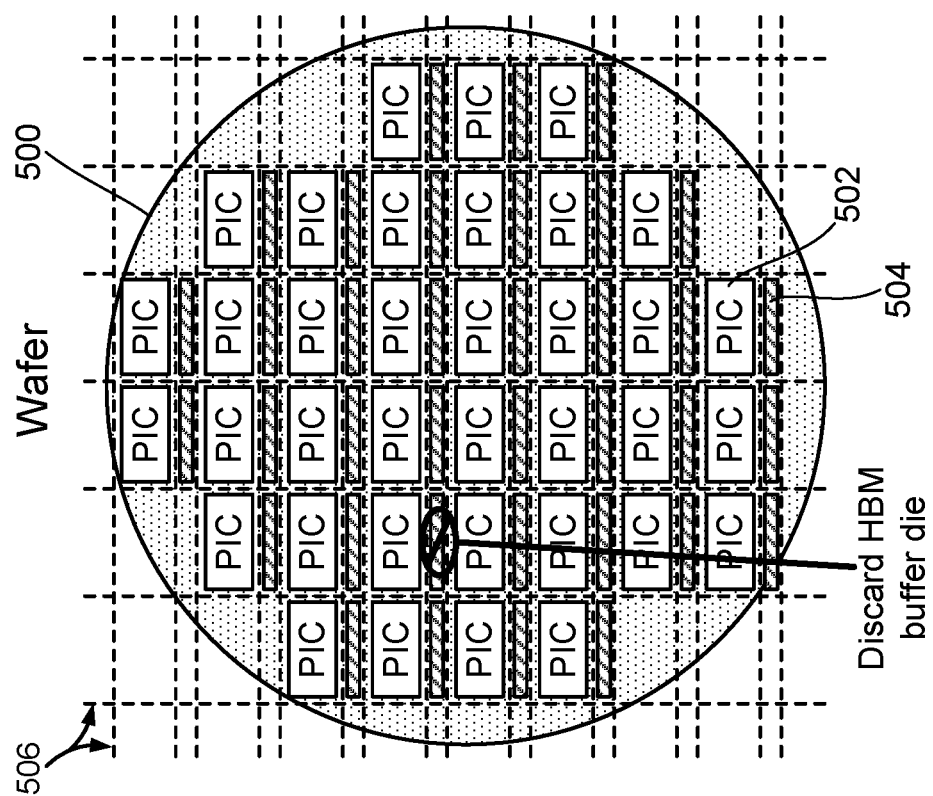

STANDALONE INTERFACE FOR STACKED SILICON INTERCONNECT (SSI) TECHNOLOGY INTEGRATION

TECHNICAL FIELD

Examples of the present disclosure generally relate to integrated circuits and, more particularly, to integrated circuit packaging using stacked silicon interconnect (SSI) technology.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

SUMMARY

One example of the present disclosure is an integrated circuit (IC) package. The IC package generally includes a package substrate; at least one interposer disposed above the package substrate and comprising a plurality of interconnection lines; a programmable IC die disposed above the interposer; a fixed feature die disposed above the interposer; and an interface die disposed above the interposer and configured to couple the programmable IC die to the fixed feature die using a first set of interconnection lines routed through the interposer between the programmable IC die and the interface die and a second set of interconnection lines routed through the interposer between the interface die and the fixed feature die.

Another example of the present disclosure is a method of fabricating an integrated circuit package. The method generally includes providing a mask for a programmable IC die paired with an interface die, the interface die for coupling the programmable IC die to a fixed feature die; generating, using the mask, a wafer having a plurality of the paired programmable IC and interface dies; dicing the wafer to detach a wafer section comprising one of the plurality of the paired programmable IC and interface dies; and disposing the wafer section above an interposer comprising a plurality of interconnection lines, wherein a first set of the interconnection lines is routed through the interposer for electrically connecting the paired programmable IC and interface dies in the wafer section and wherein a second set of the interconnection lines is routed through the interposer for electrically connecting the interface die and the fixed feature die.

Yet another example of the present disclosure is an integrated circuit package. The package generally includes a package substrate; at least one interposer disposed above the package substrate and comprising a plurality of interconnection lines; at least one field programmable gate array (FPGA) die disposed above the interposer; one or more high bandwidth memory (HBM) dies disposed above the interposer; and an HBM buffer die disposed above the interposer and configured to couple the FPGA die to the one or more HBM dies using a first set of interconnection lines routed through the interposer between the FPGA die and the HBM buffer die and a second set of interconnection lines routed through the interposer between the HBM buffer die and the one or more HBM dies. For some examples, the FPGA die and the HBM buffer die share the same wafer-level substrate. For some examples, the FPGA die and the HBM buffer die are separated on the wafer-level substrate by a scribe line.

Yet another example of the present disclosure is a wafer. The wafer generally includes a plurality of logic regions, wherein each logic region comprises a programmable IC die paired with an interface die, the interface die for coupling the programmable IC die to a fixed feature die.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

FIG. 5A is a top view of a wafer with programmable IC dies paired with HBM buffer dies, illustrating the scribe cuts where the HBM buffer dies are separated from the programmable IC dies to create logic regions, in accordance with an example of the present disclosure.

FIG. 5B is a top view of the wafer of FIG. 5A, illustrating the scribe cuts where the wafer is diced, leaving the HBM buffer die paired with the programmable IC die to create a logic region with an HBM interface, in accordance with an example of the present disclosure.

DETAILED DESCRIPTION

Examples of the present disclosure provide techniques and apparatus for adding one or more features (e.g., high bandwidth memory (HBM)) to an existing qualified stacked silicon interconnect (SSI) technology logic circuit (e.g., a programmable integrated circuit (IC), such as a super logic region (SLR)) without changing the logic circuit (e.g., adding or removing blocks). The application interface and plug-in additions to the logic circuit (e.g., an HBM buffer and controller) may be designed on the same mask set as if these were a single die, with a standard scribe line separating the application plug-in portion of the logic circuit die and the interface die. The connection between the application plug-in and the interface die may be made over the scribe using interposer interconnections.

Example Integrated Circuit Package

An integrated circuit (IC) die is typically disposed in a package for electrical connection with a circuit board (e.g., a printed circuit board (PCB)). The package protects the integrated circuit die from potential physical damage and moisture, which may lead to corrosion.

Figure 2:
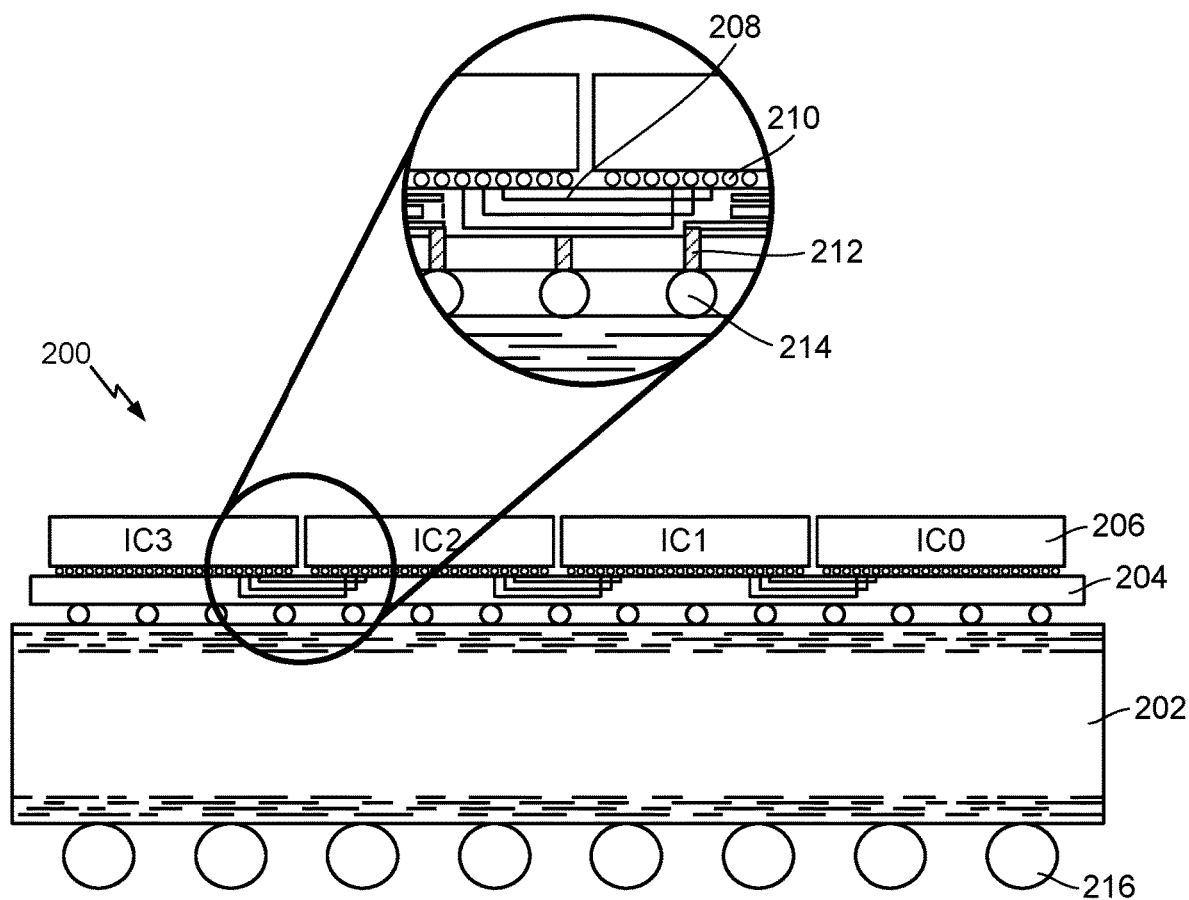
FIG. 2 is a cross-sectional view of an example integrated circuit (IC) package utilizing stacked silicon interconnect (SSI) technology, in accordance with the prior art.

FIG. 2 is a cross-sectional view of an example IC package 200 utilizing stacked silicon interconnect (SSI) technology. The IC package 200 includes a package substrate 202, an interposer 204 disposed above the substrate 202, a plurality of IC dies 206 disposed above the interposer 204, and an encapsulation material (not shown). The encapsulation material may be any of various suitable substances (e.g., resin) for encapsulating and protecting the IC dies 206. The IC dies 206 may include any of various suitable dies, including highly manufacturable field programmable gate array (FPGA) die slices, referred to as super logic regions (SLRs). Four IC dies 206 (IC0 to IC3) are illustrated in the example IC package 200 of FIG. 2, although the package may include more or less than four IC dies. SSI technology also allows dies of different types or silicon processes to be interconnected on the interposer 204.

The interposer 204 acts as an interconnect vehicle on which the IC dies 206 are set side by side and interconnected. The interposer 204 may be a passive silicon interposer, for example. Although only one interposer 204 is illustrated in FIG. 2, the IC package 200 may be implemented with multiple interposers in place of interposer 204 for some examples. The interposer 204 may include a plurality of interconnect lines 208, which may provide high-bandwidth, low-latency connections through the interposer 204. A plurality of microbumps 210 may be disposed above the interposer 204 for connecting electrically conductive pads of the IC dies 206 to the interconnect lines 208. The interposer 204 may also include a plurality of through-silicon vias (TSVs) 212 for routing connections between the IC dies 206 and a plurality of eutectic bumps 214 (e.g., controlled-collapse chip connection (C4) bumps) disposed between the interposer 204 and the package substrate 202. The TSVs 212 may provide the connections between the IC dies 206 and the substrate 202 for the parallel and serial I/O, power/ground, clocking, configuration signals, and the like. The plurality of eutectic bumps 214 electrically connect the interposer 204 to the substrate 202, and more particularly to conductive elements on the surface of and vias in the substrate.

The IC package 200 also has a plurality of solder balls 216 disposed below the package substrate 202. The solder balls 216 may be arranged, for example, in an array of rows and columns for making electrical contact with a matching arrangement of conductive pads disposed on a surface of a circuit board (e.g., a PCB).

Example Programmable Integrated Circuits

Many different types of integrated circuit (IC) dies 206 may be disposed on the interposer 204 and packaged in the IC package 200. One suitable type of IC is a programmable IC, such as a field programmable gate array (FPGA). An FPGA typically includes an array of programmable tiles. These programmable files may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs are programmed by applying a processing layer, such as a metal layer, that programmably interconnects the various elements on the device. These programmable ICs are known as mask programmable devices. The phrase "programmable IC" can also encompass devices that are only partially programmable, such as application-specific integrated circuits (ASICs).

Figure 1:
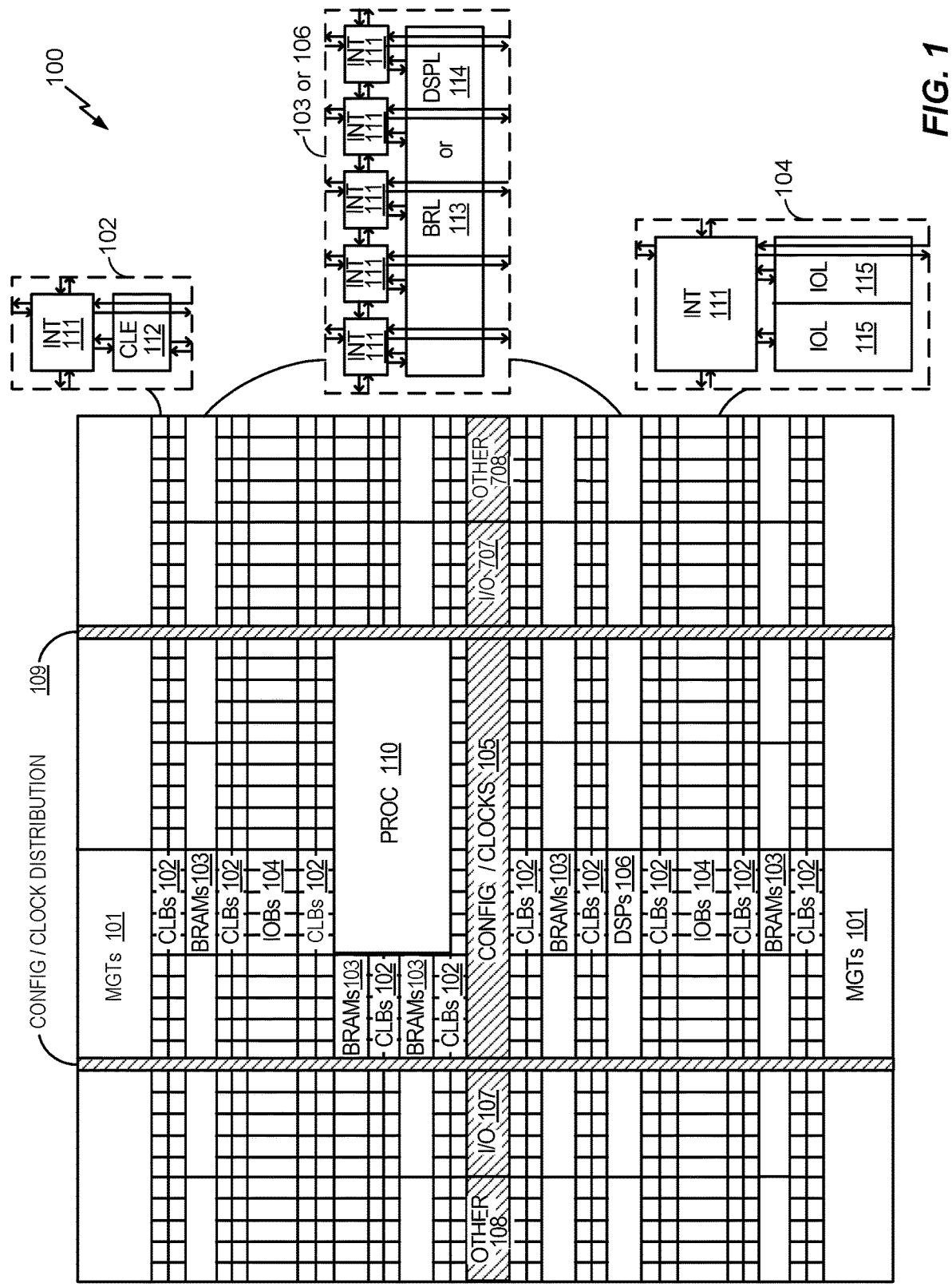
FIG. 1 is a block diagram illustrating an example architecture for a programmable device.

FIG. 1 is a block diagram illustrating an example architecture 100 for a programmable device, which may be implemented in the IC package 200 of FIG. 2. The architecture 100 may be implemented within a field programmable gate array (FPGA), for example. As shown, the architecture 100 includes several different types of programmable circuitry, e.g., logic, blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Example Standalone Interface for SSI Technology Integration

As described above, stacked silicon interconnect (SSI) technology devices use an interposer to connect multiple integrated circuit (IC) dies together using fine microbumps and metal traces much denser than what is available in conventional IC package technology or PCB technology. It may be desirable to take advantage of SSI technology for certain applications by connecting a fixed feature die (e.g., an ASIC) with an additional capability to a programmable IC die (e.g., an FPGA SLR) with connections substantially denser and faster than allowed using traditional I/O connected to package pins over a PCB. For some examples, if the additional capability is to be added to the programmable IC die, then additional circuitry (e.g., buffers) may need to be added to the programmable IC die that is connected to the fixed feature die to interface with the microbumps with a function and pattern consistent with the fixed feature die. For certain applications, the large number of additional connections it would take to support the new capability may be very disruptive to the programmable IC architecture, and may involve the removal of logic and/or DSP blocks and alterations to the clocking network. When such changes are made to an existing, working programmable IC die, it may be desirable to completely requalify the entirely die, which is complex and costly.

Examples of the present disclosure avoid this disruption and requalification of the programmable IC architecture and instead leave the programmable IC die unchanged. An interface die is designed that is compatible with the interposer interconnect data and clocking microbumps and interconnect pattern of the programmable IC die (e.g., an FPGA SLR) on one side and with the microbumps and interconnect pattern of the fixed feature die(s) on the other side. The interface die functions to convert the fixed feature protocol to an interposer interconnection compatible protocol. The programmable IC die and the interface die may share the same wafer-level substrate (e.g., the same monolith of semiconducting material) after wafer dicing, but may be separated by a scribe line (a standard scribe).

Figure 3A:
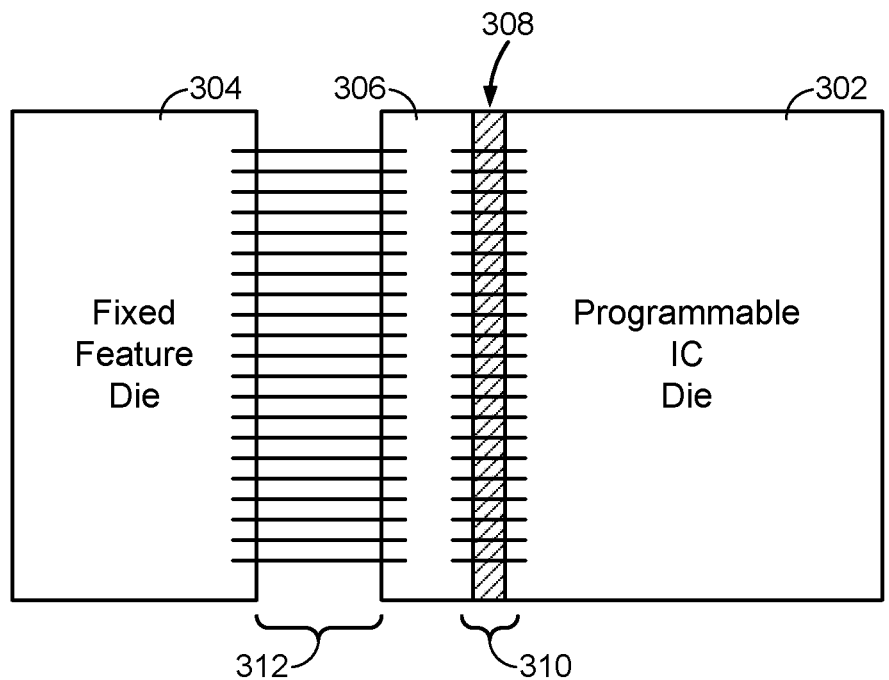
FIGS. 3A and 3B illustrate a top view and a cross-sectional view, respectively, of a portion of an example IC package comprising a programmable IC die coupled to a fixed feature die via an interface die, in accordance with examples of the present disclosure.
Figure 3B:
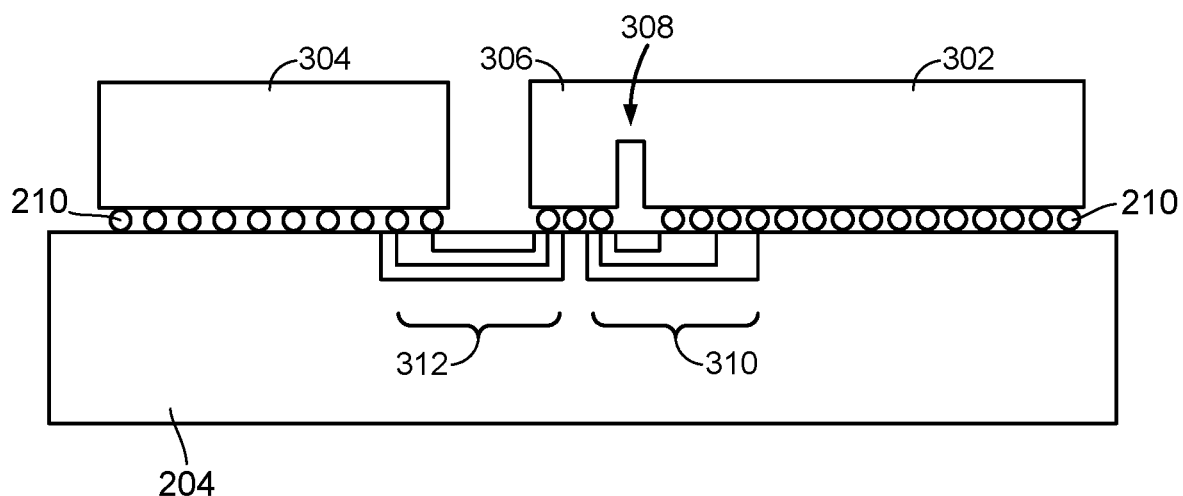

FIGS. 3A and 3B illustrate a top view and a cross-sectional view, respectively, of a portion of an example IC package (e.g., at the interposer level) comprising a programmable IC die 302 coupled to a fixed feature die 304 via an interface die 306, in accordance with examples of the present disclosure. A mask may be used to generate a wafer with the several instances of the programmable IC die 302 paired with the interface die 306. After dicing, the programmable IC die 302 and the interface die 306 may share the same wafer-level substrate, as illustrated in FIG. 3B. A scribe line 308 may separate the interface die 306 from the programmable IC die 302, and there may be no direct electrical connections between the two dies through the wafer section. Instead, a first set of interconnect lines 310 through the interposer 204 may be used to electrically connect circuits in the programmable IC die 302 and the interface die 306. One side of the interface die 306 is designed to be compatible with a pattern of the microbumps 210 and the first set of interconnect lines 310 for the programmable IC die 302. A second set of interconnect lines 312 routed through the interposer 204 may be used to electrically connect circuits in the fixed feature die 304 and the interface die 306. Another side of the interface die is designed to be compatible with a pattern of the microbumps 210 and the second set of interconnect lines 312 for the fixed feature die 304. In this manner, the design of the interface die 306 and the use of the interconnect lines 208 in the interposer 204 permit integrating the additional capability of the fixed feature die 304 into the SSI technology IC package, without any change to the programmable IC die 302. Therefore, an existing, working programmable IC die need not be requalified.

One example application that may utilize SSI technology includes High Bandwidth Memory (HBM). HBM is a high-performance random access memory (RAM) instance for three-dimensional (3-D) stacked dynamic RAM (DRAM), which may be used in any of various suitable applications, such as high-performance graphics accelerators and network devices. In HBM, up to eight DRAM dies may be stacked, which may be interconnected by through-silicon vias (TSVs) and microbumps.

HBM devices may take advantage of SSI technology to connect DRAM to an programmable IC die (e.g., an FPGA die) eight to ten times (8 to 10×) denser and faster than traditional DRAM allows using traditional I/O connected to package pins over a PCB. If HBM is to be added to an FPGA, then it may be desirable to add buffers to the FPGA that is connected to the HBM. These buffers would drive the microbumps with a function and pattern consistent with a neighboring HBM. The data coming from an HBM would have a very high bandwidth (e.g., 6 terabits per second (Tbps) per HDM device). Adding the tens of thousands of desired connections to the FPGA would be very disruptive to the FPGA architecture, involving removal of logic and DSP blocks from the regularity of the FPGA fabric to add connections from the HBM buffer. The addition may also disrupt the FPGA clocking network. Besides having to design a new HBM buffer, the IC manufacturer may also develop new blocks related to clocking, CLE, and/or DSP in an effort to add HBM support. As described above, the qualification of an FPGA (SLR) is very complex. Furthermore, it is expected that the HBM standard will change over the life of a typical FPGA product. A change to the standard may entail the redesign of the HBM buffer and the entire FPGA (SLR) and a complete requalification.

Examples of the present disclosure leave the FPGA (SLR) unchanged. An HBM buffer die may be designed that is compatible with the interposer interconnect data and clocking microbumps and interconnect pattern of the FPGA (SLR) on one side and with the microbumps and interconnect pattern of the HBM memory (or memories) on the other side. The function of the HBM buffer die is to convert HBM protocol to an interposer interconnect compatible protocol like AXI (Advanced eXtensible Interface). The FPGA and HBM buffer devices may share the same wafer-level substrate, but may be separated by a scribe line, as described above. Although an HBM application and an HBM buffer die are used as examples throughout the present disclosure, it is to be understood that any suitable application (and application-specific integrated circuit (ASIC) die) may be integrated in an SSI technology IC package using a suitable interface die.

Figure 4:
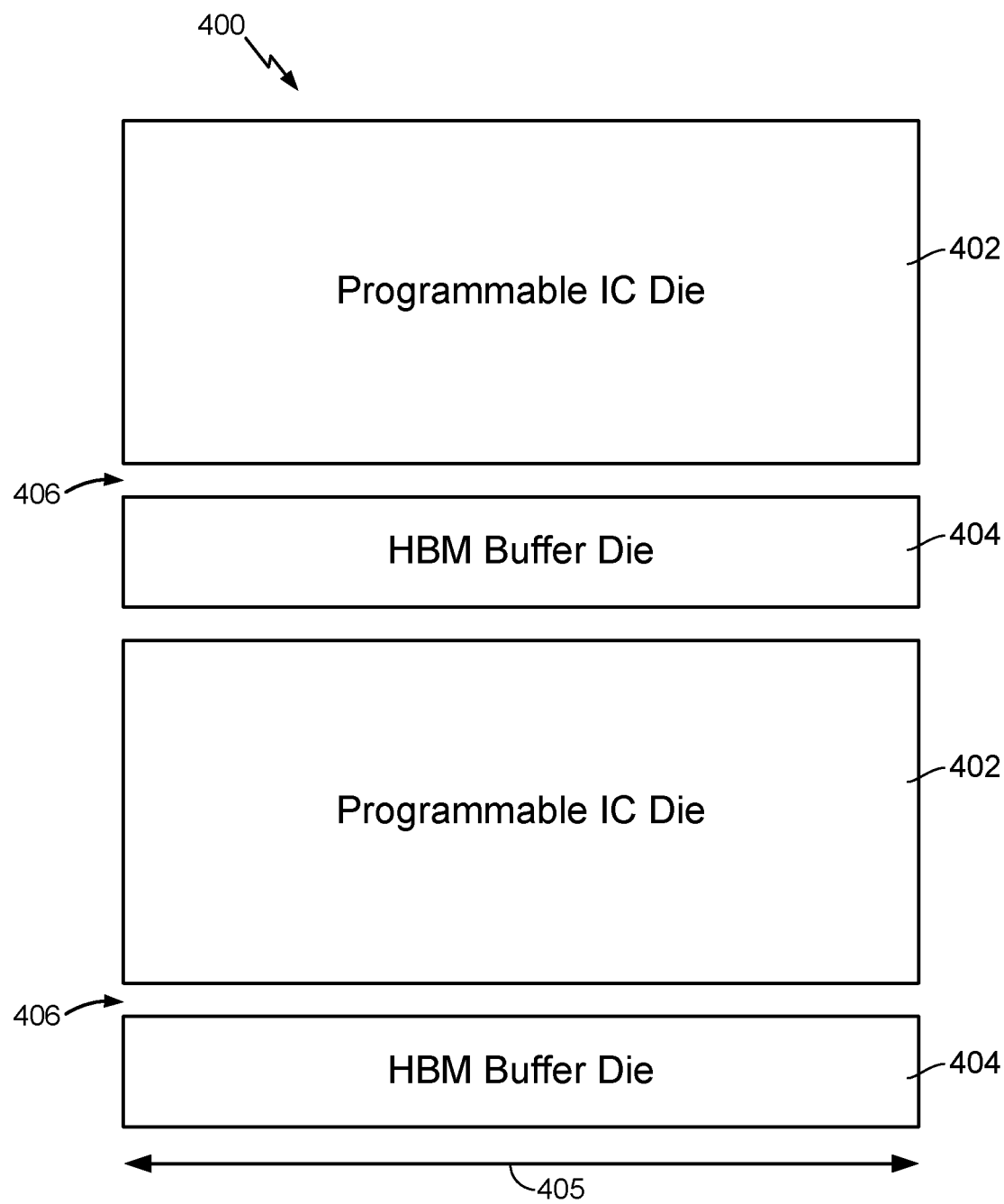
FIG. 4 illustrates an example mask for a pair of logic regions, each logic region including a programmable IC die and a high bandwidth memory (HBM) buffer die, in accordance with an example of the present disclosure.

FIG. 4 illustrates an example mask 400 for a pair of logic regions, in accordance with an example of the present disclosure. Each logic region includes a programmable IC die 402 and an HBM buffer die 404. Although a pair of logic regions are illustrated in the example mask 400 of FIG. 4, a mask may have only one logic region or more than two logic regions. FIG. 4 shows the programmable IC die 402 and the HBM buffer die 404 as having the same width 405 and being separated by a scribe line 406. This scribe line 406 may have a standard width. For other examples, the HBM buffer die 404 may have a different width than the programmable IC die 402. The HBM buffer die 404 and the programmable IC die 402 may have compatible interposer interconnect microbump patterns. The mask 400 in FIG. 4 may be used to make the wafers shown in FIGS. 5A and 5B.

FIGS. 5A and 5B illustrate how one mask set can be used to make two different logic regions. FIG. 5A is a top view of a wafer 500 with logic regions (e.g., SLRs) including programmable IC die 502 paired with an HBM buffer die 504, in accordance with an example of the present disclosure. The dashed lines 506 represent scribe cuts where the wafer 500 is diced, and the HBM buffer die 504 is separated from the programmable IC (PIC) die 502. The wafer 500 in FIG. 5A can be used to produce, for example, traditional SSI technology FPGA SLRs. The separated HBM buffer dies 504 may be discarded.

FIG. 5B is a top view of a wafer 520 with an HBM interface, in accordance with an example of the present disclosure. The wafer 520 may be the same starting wafer as the wafer 500 of FIG. 5A, but the scribe cuts are different. The wafer 520 in FIG. 5B is diced such that the PL die 502 and the HBM buffer die 504 are paired together as a single logic region (e.g., SLR). The HBM buffer and PL portions may be separated by a scribe and may not have any direct electrical connections in the diced wafer section. Rather, the connections between the two portions may be made by interconnect lines in the SSI interposer.

These interconnect lines 310 in the interposer 204 are designed to create wide, high-bandwidth connections between dies. Further, the interconnect lines 310 may be designed to distribute the bandwidth of the connection over enough of the programmable logic (e.g., FPGA) to absorb the astounding bandwidth of HBM. The separation (e.g., by a scribe line) of the programmable IC die and the HBM buffer die also serves to reduce the risk and increase vendor flexibility. In this manner, a problem with the HBM or HBM buffer die or a change in the HBM standard will not impact the usefulness of the programmable logic. Further, if the HBM design is changed due to HBM vendor differences or the evolution of the HBM standard, the programmable logic need not be disturbed. This will save an immense amount of qualification time, especially since the HBM-to-PIC connection over the interposer interconnect lines 310 may be soft and may not involve a mask change to modify. This soft connection over the interconnect lines 310 may be implemented with bidirectional drivers at the ends of each interconnect line, which can be controlled to adjust which lines are connected.

Figure 6:
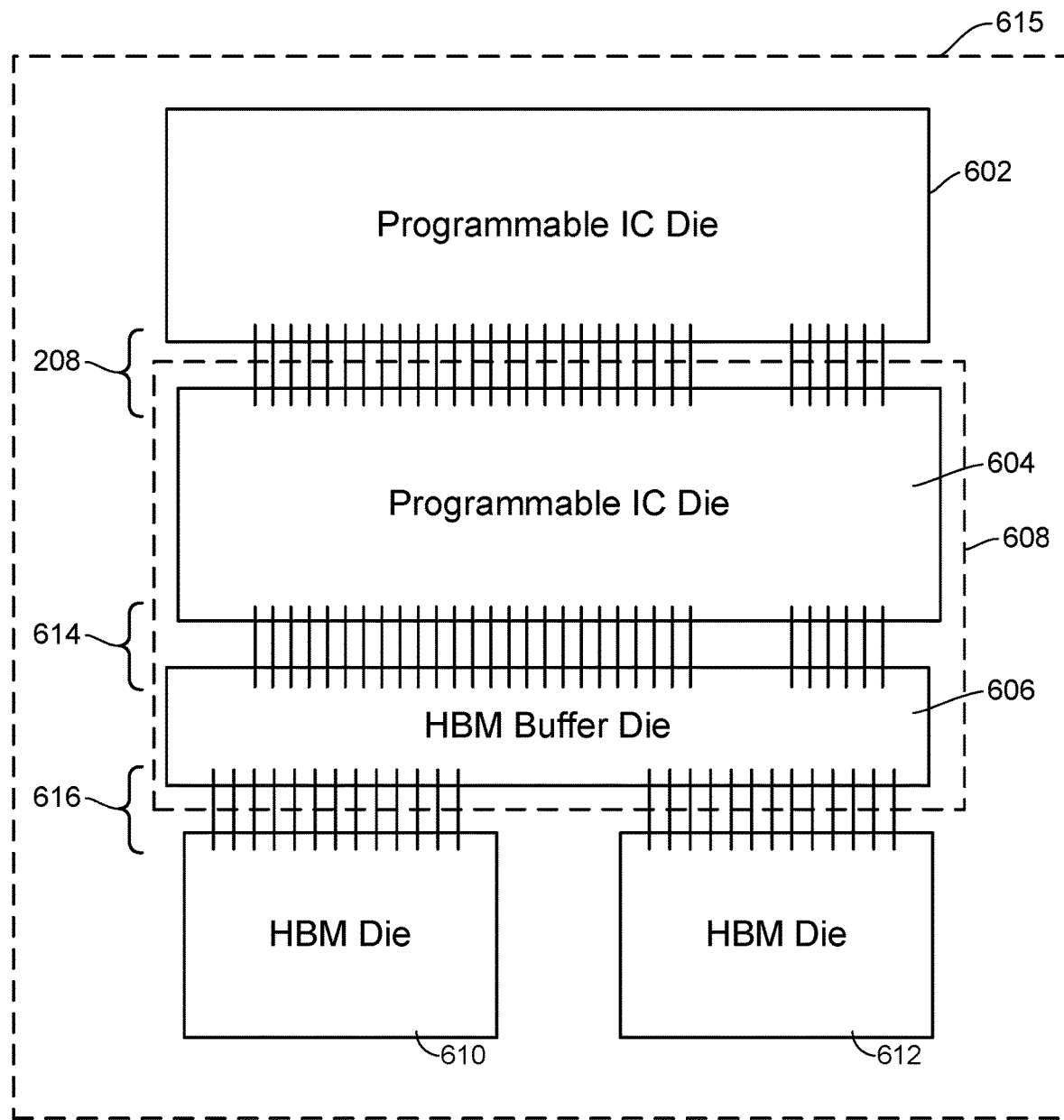
FIG. 6 illustrates a top view of a portion of an example IC package utilizing SSI technology comprising a first logic region, a second logic region with an HBM interface, and HBM dies, in accordance with an example of the present disclosure.

FIG. 6 illustrates a top view of a portion of an example IC package (e.g., at the interposer level) utilizing SSI technology, in accordance with an example of the present disclosure. The portion of the IC package includes a first logic region 602 (comprising a first programmable IC die) coupled to a second logic region 608 (comprising a second programmable IC die 604 paired with an HBM buffer die 606), where the second logic region may be referred to as a logic region with an HBM interface. The HBM buffer die 606 is coupled to two HBM dies 610, 612. Although the programmable IC die 604 and the HBM buffer die 606 are independent, these dies may be diced from a wafer as a single logic region 608. The two dies 604, 606 in the second logic region 608 may be connected using a first set of interconnection lines 614 routed through the interposer 615. The interconnection lines 614 routed between the programmable IC die 604 and the HBM buffer die 606 may be the same type as the interconnect lines 208 used between the IC dies 206 in FIG. 2. For some examples, the HBM channel may entail 1440 interconnect signals at 500 megabits per second (Mbps) with 8 channels per device. Thus, there may be 16 programmable IC interconnect channels with 1440 signals between the logic region 602 and the logic region 608. The interconnection lines 616 between the HBM buffer die 606 and the HBM dies 610, 612 may use the HBM JEDEC standard on the interposer 204. For some examples, there may be 212 interconnection lines per HBM channel at 2 gigabits per second (Gbps) with 8 channels per HBM device.

Figure 7:
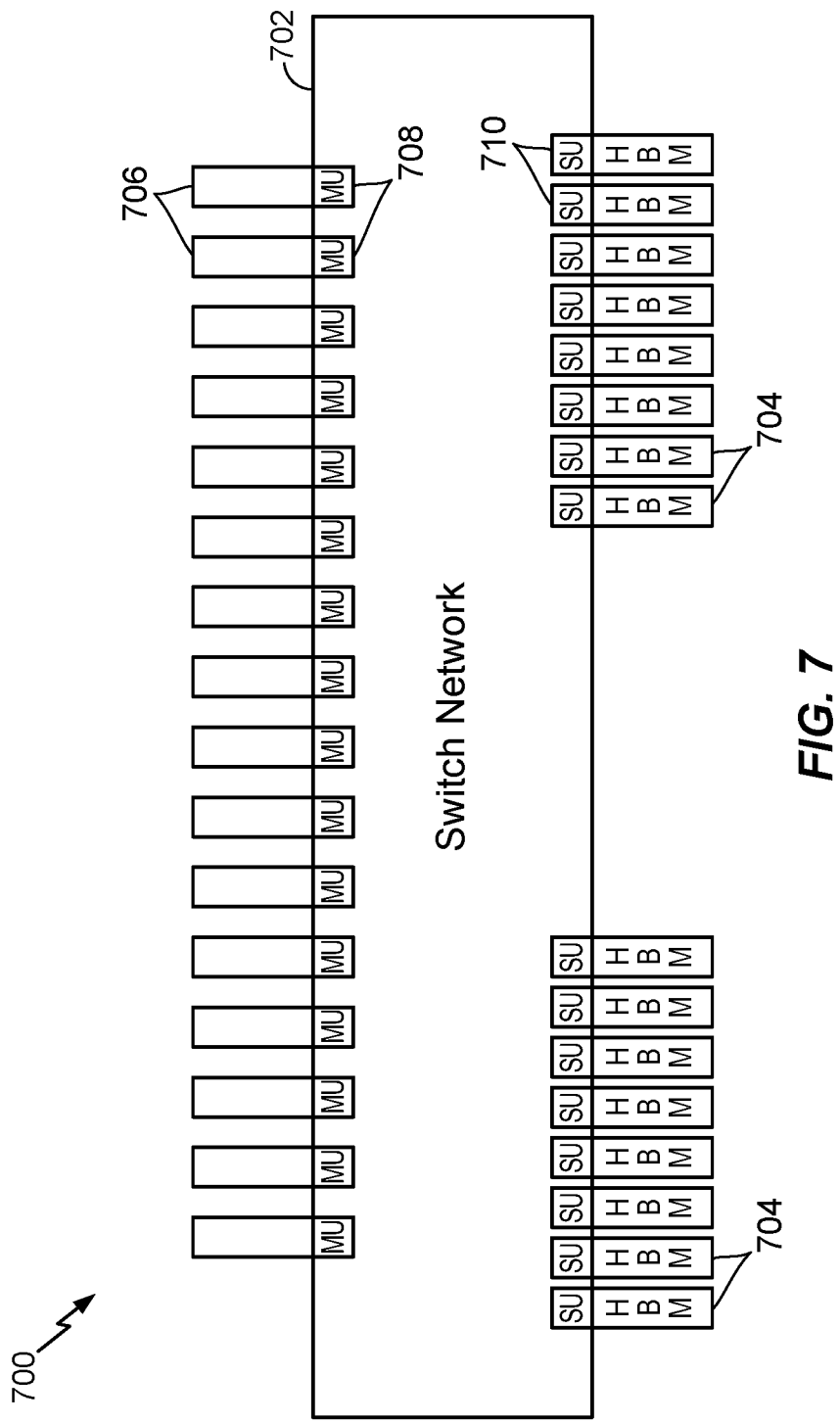
FIG. 7 is a block diagram of an example HBM buffer die, in accordance with an example of the present disclosure.

The interposer interconnections on a suitable process (e.g., 65 nm or smaller) may be very compatible with HBM bandwidth and density. FIG. 7 shows the top level design of an example HBM buffer die 700, in accordance with an example of the present disclosure. The HBM buffer die 700 may be one example implementation of the HBM buffer die 606 in FIG. 6. The signal count and bandwidth coming from the HBM die 610, 612 are nicely balanced by the interconnection signal bandwidth to the programmable IC (e.g., an FPGA). The circuit may have a switch network 702 (e.g., an AXI switch network) between the HBM channels 704 and the programmable IC interconnect channels 706. The HBM design also allows the HBM placement and the programmable IC interconnect placement to be independent.

Each master unit (MU) 708 in FIG. 7 may be, for example, a 512-bit AXI bus running at 500 MHz, which may take up most of the 1440 signals in a programmable IC interconnect channel 706. The slave unit (SU) 710 in each HBM output may also be, for example, a 512-bit AXI bus operating at 500 MHz. A HBM application of 128 bits at 2 gigabits per second (Gbps) may result in an AXI 512-bit interface at 500 MHz.

With examples of the present disclosure, HBM memory or another suitable capability can be added to an existing qualified SSI technology logic circuit without changing the logic circuit (e.g., adding or removing blocks). The application interface and plug-in additions to the logic circuit (e.g., an HBM buffer and controller) may be designed on the same mask set as if these were a single die, with a standard scribe line separating the application plug-in portion of the logic circuit die and the interface die. The connection between the application plug-in and the interface die may be made over the scribe using interposer interconnections.

There are numerous advantages provided by the standalone interface approach, according to examples of the present disclosure. Since programmable IC dies may have multiple tapeouts (e.g., engineering samples and production), the interface die (e.g., the HBM buffer die) can be added to any tapeout including production with no additional mask cost. Introducing support for additional features (e.g., HBM support) to a programmable IC (e.g., an FPGA) need not involve designing a new programmable IC and the subsequent modeling and qualification. Since interposer interconnections are already supported and modeled, adding capabilities (e.g., HBM) need not entail any additional work from various groups at the IC package designer and/or manufacturer. It may be possible for only one group to design the interface die (e.g., the HBM buffer die) knowing the design guidelines (e.g., the HBM standard) and the pattern for the interconnection signals on the programmable IC. The design may also be very portable to an outside vendor. Future changes to the design (e.g., revisions to the HBM standard) need not impact programmable IC design or qualification. The standalone interface design may be applied to any logic circuit with interconnect support.

Example Operations for Fabricating an IC Package

Figure 8:
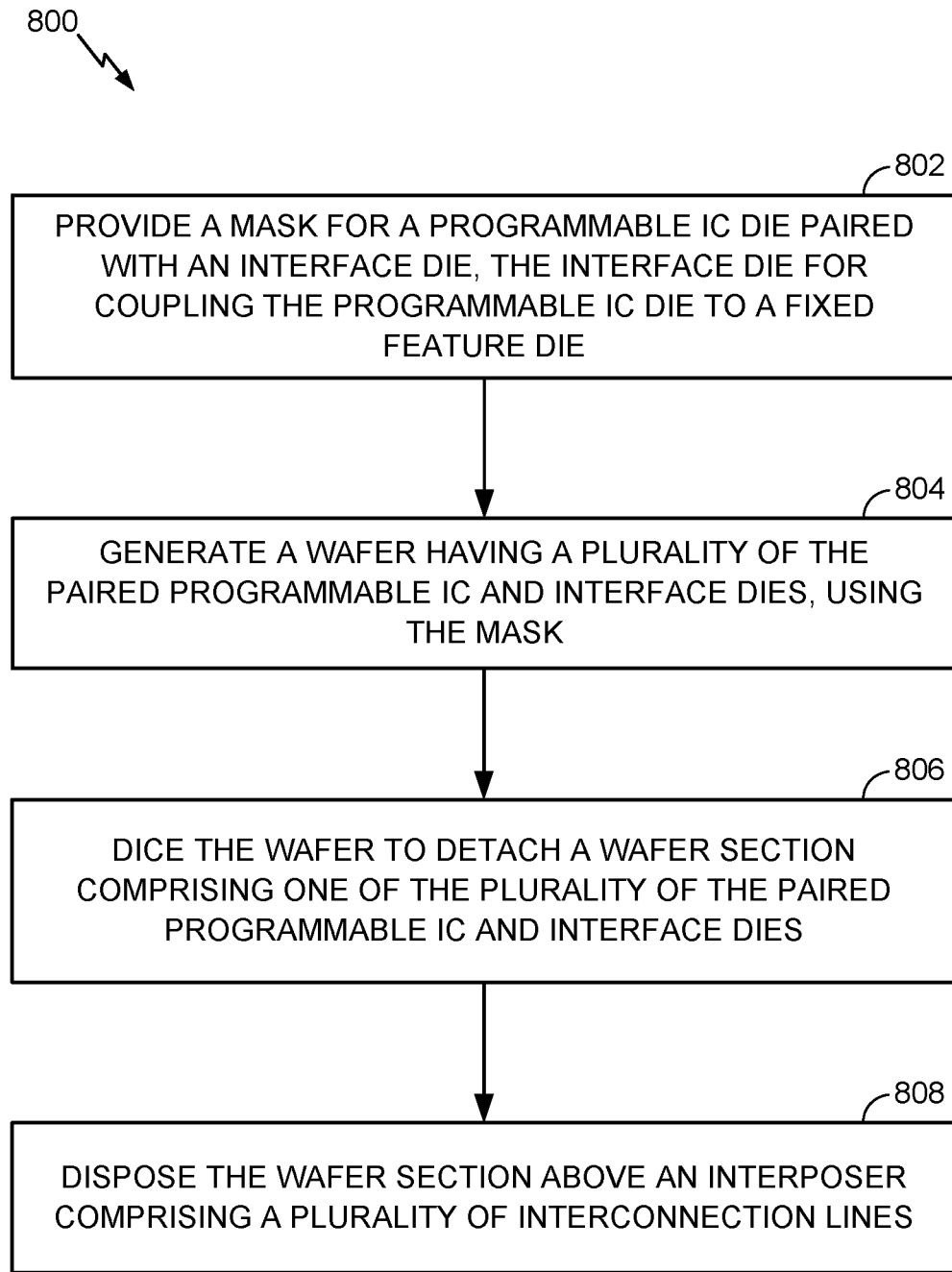
FIG. 8 is a flow diagram of example operations for fabricating an IC package, in accordance with an example of the present disclosure.

FIG. 8 is a flow diagram of example operations 800 for fabricating an IC package, in accordance with an example of the present disclosure. The operations 800 may be performed, for example, by a system for fabricating the IC package, which may include a semiconductor processing chamber.

The operations 800 may begin, at block 802, by providing a mask for a programmable IC die paired with an interface die. The interface die is for coupling the programmable IC die to at least one fixed feature die. At block 804, the mask is used to generate a wafer having a plurality of paired programmable IC and interface dies. At block 806, the wafer may be diced to detach a wafer section comprising one of the plurality of the paired programmable IC and interface dies.

At block 808, the wafer section may be disposed above an interposer comprising a plurality of interconnection lines. A first set of the interconnection lines may be routed through the interposer for electrically connecting the paired programmable IC and interface dies in the wafer section. A second set of the interconnection lines may be routed through the interposer for electrically connecting the interface die and the fixed feature die.

According to some examples, the operations 800 may further entail disposing the fixed feature die above the interposer. For some examples, the operations may further involve disposing the interposer above a package substrate and/or encapsulating the fixed feature die, the wafer section, the interposer, and at least a portion of the package substrate to form the integrated circuit package. For some examples, a plurality of microbumps may be disposed above the interposer. In this case, the plurality of microbumps may electrically connect the interconnection lines routed through the interposer with circuits in the programmable IC die, the interface die, and the fixed feature die. For some examples, the interface die in the wafer section is compatible with a first pattern of the microbumps and the first set of interconnection lines for the programmable IC die and compatible with a second pattern of the microbumps and the second set of interconnection lines for the fixed feature die.

According to some examples, the operations 800 may further include forming a scribe line between the programmable IC die and the interface die in each of the paired programmable IC and interface dies.

According to some examples, the paired programmable IC and interface dies in the wafer section share the same wafer-level substrate.

According to some examples, the fixed feature die comprises an HBM die. In this case, the interface die may comprise an HBM buffer die. For some examples, the second set of interconnection lines is in accordance with the HBM JEDEC standard.

According to some examples, the fixed feature die comprises an application-specific integrated circuit (ASIC).

According to some examples, there are no electrical connections between the paired programmable IC and interface dies in the wafer section, other than through the interconnection lines routed through the interposer.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. An integrated circuit (IC) package comprising:
    a package substrate;
    at least one interposer disposed above the package substrate and comprising a plurality of interconnection lines;
    a programmable IC die disposed above the interposer;
    a fixed feature die disposed above the interposer; and
    an interface die disposed above the interposer and configured to couple the programmable IC die to the fixed feature die using a first set of interconnection lines routed through the interposer between the programmable IC die and the interface die and a second set of interconnection lines routed through the interposer between the interface die and the fixed feature die, wherein the programmable IC die and the interface die share a same semiconductor substrate in the IC package, layers of the programmable IC die and layers of the interface die both being disposed on the semiconductor substrate.

2. The package of claim 1, wherein the programmable IC die and the interface die are separated on the semiconductor substrate by a scribe line.

3. The package of claim 1, further comprising a plurality of microbumps electrically connecting the interconnection lines routed through the interposer with circuits in the programmable IC die, the interface die, and the fixed feature die.

4. The package of claim 3, wherein the interface die is compatible with a first pattern of the microbumps and the first set of interconnection lines for the programmable IC die and is compatible with a second pattern of the microbumps and the second set of interconnection lines for the fixed feature die.

5. The package of claim 1, wherein the programmable IC die comprises a field programmable gate array (FPGA) die, wherein the fixed feature die comprises a high bandwidth memory (HBM) die, and wherein the interface die comprises an HBM buffer die.

6. The package of claim 5, wherein the second set of interconnection lines is in accordance with the HBM JEDEC standard.

7. The package of claim 1, wherein the fixed feature die comprises an application-specific integrated circuit (ASIC).

8. The package of claim 1, wherein there are no electrical connections between the programmable IC die and the interface die, other than through the interconnection lines routed through the interposer.

9. The package of claim 1, wherein the programmable IC and the interface continued to share the semiconductor substrate after dicing of a wafer of which the semiconductor substrate was a portion.

10. The package of claim 1, wherein the semiconductor substrate, the programmable IC die, and the interface die each compose at least a portion of a monolith in the IC package.

11. An integrated circuit (IC) package comprising:
a package substrate;
at least one interposer disposed above the package substrate and comprising a plurality of interconnection lines;
a fixed feature die disposed above the interposer; and
a monolith disposed above the interposer, the monolith comprising:
a semiconductor substrate;
a programmable IC die disposed on the semiconductor substrate; and
an interface die disposed on and sharing the semiconductor substrate with the programmable IC die, the interface die being configured to couple the programmable IC die to the fixed feature die via a first set of interconnection lines routed through the interposer between the programmable IC die and the interface die and a second set of interconnection lines routed through the interposer between the interface die and the fixed feature die.

12. The IC package of claim 11, wherein the programmable IC die and the interface die are separated in the monolith by a scribe line.

13. The IC package of claim 11, wherein there are no electrical connections in the monolith between the programmable IC die and the interface die, other than through the first set of interconnection lines routed through the interposer.

14. The IC package of claim 11, wherein the programmable IC die comprises a field programmable gate array (FPGA) die, wherein the fixed feature die comprises a high bandwidth memory (HBM) die, and wherein the interface die comprises an HBM buffer die.

15. An integrated circuit (IC) package comprising:
a package substrate;
an interposer disposed on and attached to the package substrate, the interposer comprising first interconnect lines and second interconnect lines;
a fixed feature die attached to the interposer by first connectors; and
a monolith attached to the interposer by second connectors, the monolith being disposed on a same side of the interposer as the fixed feature die, the monolith comprising:
a semiconductor substrate;
a programmable circuit disposed on the semiconductor substrate; and
an interface circuit disposed on the semiconductor substrate, a scribe line being disposed on the semiconductor substrate between the programmable circuit and the interface circuit, no electrical connections between the programmable circuit and the interface circuit being across the scribe line and in the monolith, the programmable circuit being electrically connected to the interface circuit through a first set of the second connectors and the second interconnect lines of the interposer, the interface circuit being electrically connected to the fixed feature die through at a second set of the second connectors, at least some of the first connectors, and the first interconnect lines of the interposer.

* * * * *